(12) United States Patent
Zhou

(10) Patent No.: US 10,431,136 B2
(45) Date of Patent: Oct. 1, 2019

(54) ARRAY SUBSTRATE, DISPLAY PANEL, AND DISPLAY DEVICE

(71) Applicant: XIAMEN TIANMA MICRO-ELECTRONICS CO., LTD., Xiamen (CN)

(72) Inventor: Hongbo Zhou, Xiamen (CN)

(73) Assignee: XIAMEN TIANMA MICRO-ELECTRONICS CO., LTD., Xiamen (CN)

( * ) Notice: Subject to any disclaimer, the term of this patent is extended or adjusted under 35 U.S.C. 154(b) by 104 days.

(21) Appl. No.: 15/793,035

(22) Filed: Oct. 25, 2017

(65) Prior Publication Data
US 2018/0330653 A1 Nov. 15, 2018

(30) Foreign Application Priority Data

May 15, 2017 (CN) .......................... 2017 1 0339374

(51) Int. Cl.
| | |
|---|---|
| *G09G 3/20* | (2006.01) |
| *G02F 1/1345* | (2006.01) |
| *H01L 27/12* | (2006.01) |
| *G09G 3/00* | (2006.01) |

(52) U.S. Cl.
CPC ........... *G09G 3/20* (2013.01); *G02F 1/13452* (2013.01); *G09G 3/006* (2013.01); *H01L 27/124* (2013.01); *G02F 1/13454* (2013.01); *G02F 2001/13456* (2013.01); *G09G 2310/0297* (2013.01)

(58) Field of Classification Search
CPC .. G09G 3/006; G09G 3/3648; G09G 2300/04; G09G 3/3688; G09G 3/3677; G01R 31/00; G01R 31/28; G02F 1/1309
See application file for complete search history.

(56) References Cited

U.S. PATENT DOCUMENTS

| | | | |
|---|---|---|---|
| 2007/0103176 A1* | 5/2007 | Mostarshed ....... | G01R 31/2889 324/762.02 |
| 2008/0054798 A1* | 3/2008 | Jeong ..................... | G09G 3/006 313/504 |
| 2014/0354286 A1* | 12/2014 | Kim ........................ | G09G 3/006 324/414 |
| 2016/0105952 A1* | 4/2016 | Park ..................... | G02F 1/1309 345/174 |

FOREIGN PATENT DOCUMENTS

| | | |
|---|---|---|
| CN | 106200161 A | 12/2016 |
| KR | 10 2007 0049718 | 5/2007 |

* cited by examiner

*Primary Examiner* — Kevin M Nguyen
(74) *Attorney, Agent, or Firm* — Alston & Bird LLP

(57) ABSTRACT

The disclosure discloses an array substrate, a display panel, and a display device, and the array substrate includes: a plurality of data lines arranged in a display area, and a demultiplexer assembly, a test switch assembly, and a plurality of data signal fanout wires, arranged respectively in a non-display area, where each of the signal output terminals of the demultiplexer assembly is electrically connected with one of the plurality of data lines, each of the signal input terminals of the demultiplexer assembly is electrically connected respectively with one of the plurality of data signal fanout wires, and one of the output terminals of the test switch assembly; and the test switch assembly is arranged on the side of the demultiplexer assembly away from the display area.

17 Claims, 15 Drawing Sheets

ARRAY SUBSTRATE, DISPLAY PANEL, AND DISPLAY DEVICE

This application claims the benefit of Chinese Patent Application No. CN 201710339374.X, filed with the Chinese Patent Office on May 15, 2017, which is hereby incorporated by reference in its entirety.

FIELD

The present disclosure relates to the field of display technologies, and in particular to an array substrate, a display panel, and a display device.

BACKGROUND

To improve a display quality on a display device, people have come to a narrow border design for the display device, and particularly to a splicing screen for large screen outdoor display. In this configuration the width effect of the seam in the splicing screen can be reduced with the narrow border to thereby significantly improve the display quality as a whole.

It is common currently to fabricate the display device with the narrow border by reducing the sizes of elements at the border. However this may be limit by how much the sizes of the elements in non-display area can be reduced. The fabrication process may be demanding, thus affecting yield and performance of the product as well.

In view of this, it is highly desirable to reduce the lower border width in a narrow border without affecting the performance and respective elements' size at the lower border.

SUMMARY

Embodiments of the disclosure provide an array substrate, a display panel, and a display device to address the problem of a large width in a non-display area of the array substrate that may discourage a narrow border thereof.

An embodiment of the disclosure provides an array substrate including a display area, and a non-display area surrounding the display area, wherein the array substrate includes: a plurality of data lines arranged in the display area, and a demultiplexer assembly, a test switch assembly, and a plurality of data signal fanout wires, which are arranged respectively in the non-display area, wherein:

signal output terminals of the demultiplexer assembly are electrically connected with the plurality of data lines, first signal input terminals of the demultiplexer assembly are electrically connected with the plurality of data signal fanout wires, and second signal input terminals of the demultiplexer assembly are electrically connected with output terminals of the test switch assembly;

the test switch assembly is arranged on a side of the demultiplexer assembly away from the display area; and the plurality of data signal fanout wires overlap with, and are arranged at a different layer from, the test switch assembly.

In another aspect, an embodiment of the disclosure provides a display panel including the array substrate above according to the embodiment of the disclosure.

In another aspect, an embodiment of the disclosure provides a display device including the display panel above according to the embodiment of the disclosure.

Advantageous effects of the embodiments of the disclosure are as follows.

In the array substrate, the display panel, and the display device according to the embodiments of the disclosure, the plurality of data signal fanout wires and the test switch assembly, arranged in the non-display area are changed to be arranged at different layers so that they overlap, unlike the elements arranged in a sequential order in the non-display area of the existing array substrate, and in this way, the width of the non-display area can be reduced without affecting the performance and the sizes of the respective elements at the lower border, for the effect of a narrow border of the array substrate without being more demanding for the fabrication process, and without degrading the good yield ratio.

DETAILED DESCRIPTION OF THE EMBODIMENTS

Figure 1A:
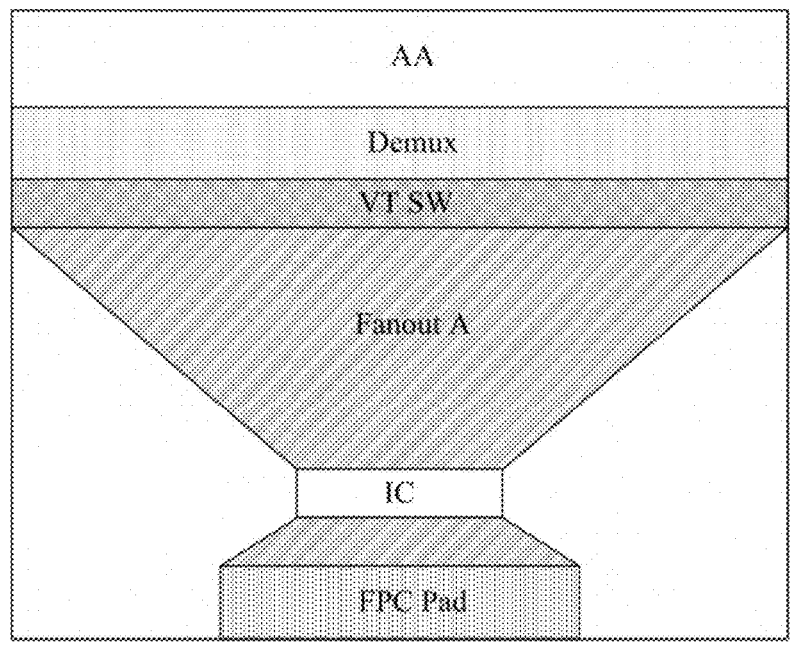
FIG. 1A is a schematic structural diagram of an array substrate in the prior art.

An array substrate, a display panel, and a display device according to embodiments of the disclosure will be described below in details with reference to the drawings.

The shapes and sizes of respective elements in the drawings are not intended to reflect a real proportion of the array substrate, but only intended to illustrate the contents of the disclosure.

At present, in an existing array substrate, there are typically arranged in a non-display area on a side, e.g., a lower border, a demultiplexer assembly Demux, a test switch assembly VT SW, a data signal fanout wire Fanout A, a driver chip IC, a flexible printed circuit pad FPC PAD, and other elements as illustrated in FIG. 1A.

The demultiplexer assembly Demux, the test switch assembly VT SW, the data signal fanout wire Fanout A, the driver chip IC, and the flexible printed circuit pad FPC PAD are arranged at the lower border in that order from a display area to the outer edge, so the total width of the lower border is typically the sum of the widths of these several elements.

Particularly the sum of the widths of the demultiplexer assembly Demux and the test switch assembly VT SW is typically approximately 700 µm, the width of the data signal fanout wire Fanout A is typically approximately 2080 µm, and the sum of the widths of the driver chip IC, and the flexible printed circuit pad FPC PAD is typically approximately 2300 µm, so the width of the lower border will be at least 5080 µm to be satisfactory.

In order to reduce the width of the lower border for the effect of a narrow border, this effect can only be done at present by reducing the sizes of the demultiplexer assembly Demux, the test switch assembly VT SW, the data signal fanout wire Fanout A, and the other elements, but this practice may suffer from a limited factor by which the sizes of the elements are reduced, but also may be demanding for the fabrication process, lower the good yield ratio, and degrade the performance of the product to some extent as well.

In view of this, how to reduce the width of the lower border for the effect of a narrow border without affecting the performance and the sizes of the respective elements at the lower border is a technical problem highly desirable to be addressed in the art.

Figure 2A:
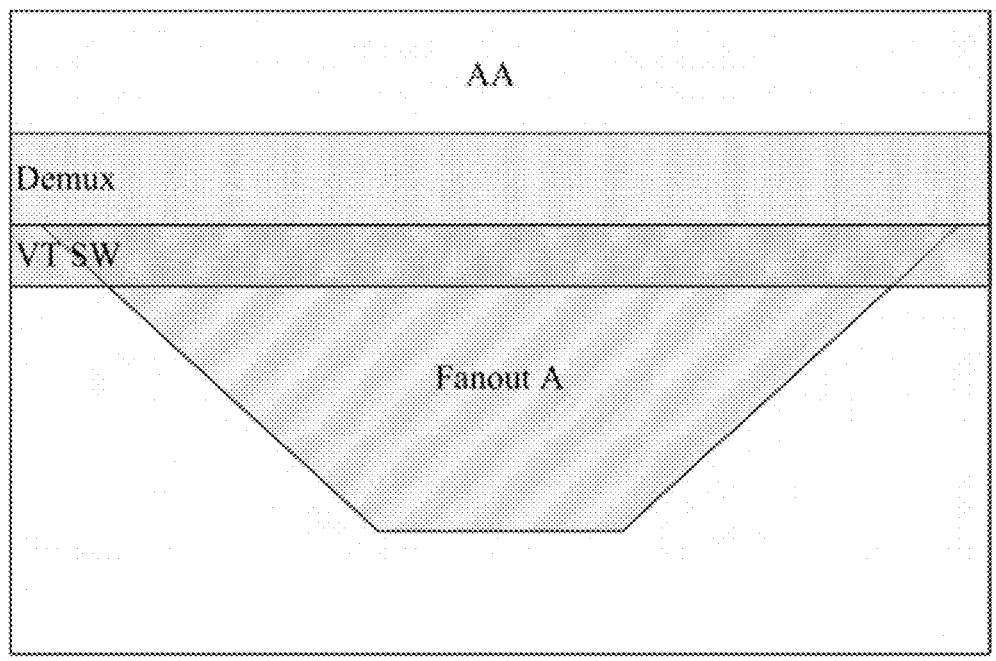
FIG. 2A to FIG. 2C are schematic structural diagrams respectively of an array substrate according to embodiments of the disclosure.
Figure 2B:
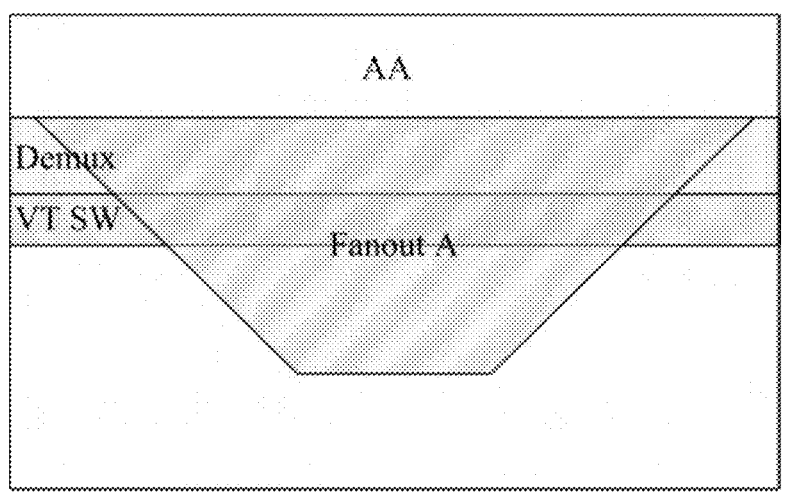
Figure 2C:
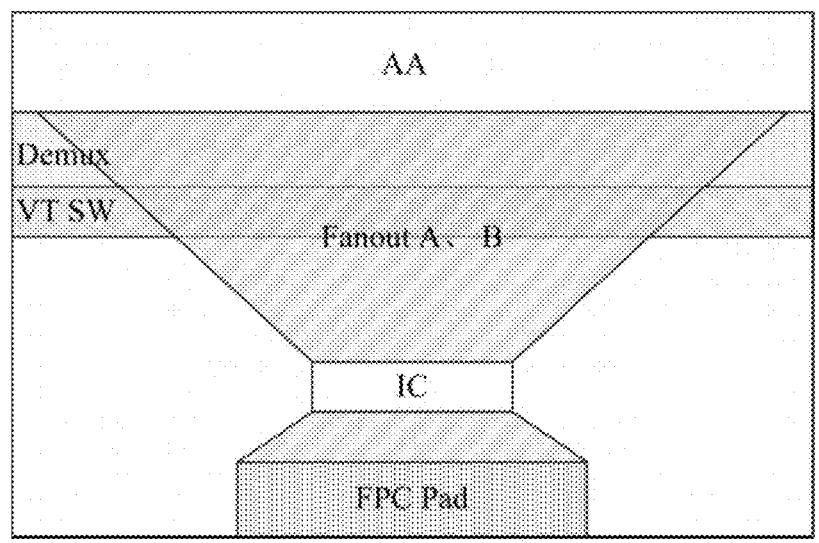

Hereupon an embodiment of the disclosure provides an array substrate as illustrated in FIG. 2A to FIG. 2C including a display area AA, and a non-display area surrounding the display area AA (only the non-display area at a lower border is illustrated in FIG. 2A to FIG. 2C), and the array substrate specifically includes: a plurality of data lines Data arranged in the display area AA (not illustrated in FIG. 2A to FIG. 2C, but illustrated in FIG. 3A to FIG. 3D), and a demultiplexer assembly Demux, a test switch assembly VT SW, and a plurality of data signal fanout wires Fanout A, which are arranged respectively in the non-display area.

As illustrated in FIG. 3A to FIG. 3D, signal output terminals a of the demultiplexer assembly Demux are electrically connected with the plurality of data lines Data, first signal input terminals b of the demultiplexer assembly Demux are electrically connected with plurality of data signal fanout wires Fanout A, and second signal input terminals c of the demultiplexer assembly Demux are electrically connected with output terminals of the test switch assembly VT SW.

As illustrated in FIG. 2A to FIG. 2C, the test switch assembly VT SW is arranged on the side of the demultiplexer assembly Demux away from the display area AA.

As illustrated in FIG. 2A to FIG. 2C, the plurality of data signal fanout wires Fanout A overlaps with, and is arranged at a different layer from, the test switch assembly VT SW.

Specifically in the array substrate above according to the embodiment of the disclosure, the plurality of data signal fanout wires Fanout A and the test switch assembly VT SW, arranged in the non-display area are changed to be arranged at different layers, that is, the structures of the elements are arranged at different layers, for example, the plurality of data signal fanout wires Fanout A may be arranged above the film layer where the test switch assembly VT SW is located so that their positive projections onto the array substrate overlap, and furthermore their structures are adjusted so that they overlap, unlike the elements arranged in a sequential order in the non-display area of the existing array substrate, and in this way, the width of the non-display area can be reduced without affecting the performance and the sizes of the respective elements at the lower border, for the effect of a narrow border of the array substrate without being more demanding for the fabrication process, and without degrading the good yield ratio.

Figure 3A:
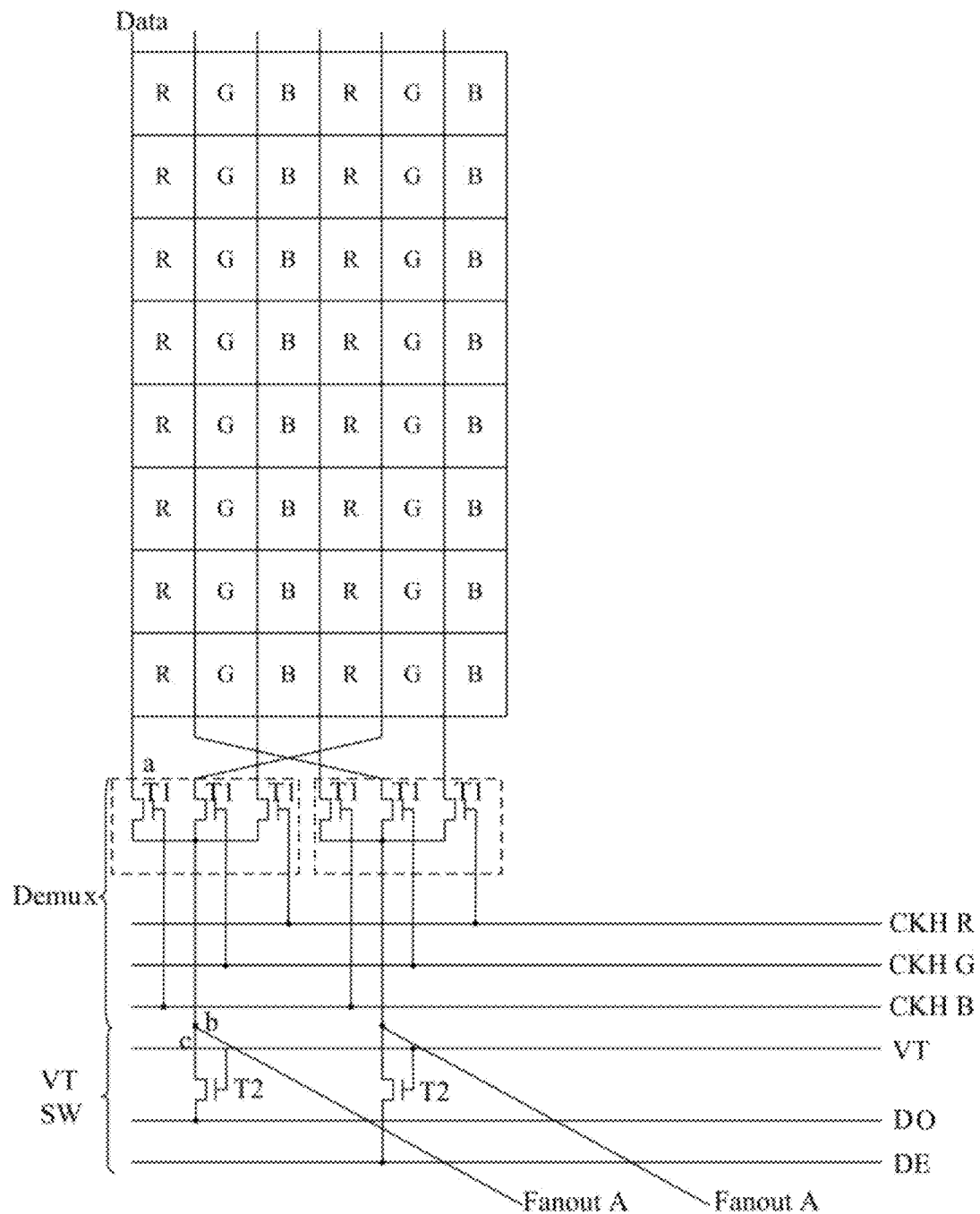
FIG. 3A to FIG. 3D are schematic structural circuit diagrams respectively of an array substrate according to embodiments of the disclosure.
Figure 4A:
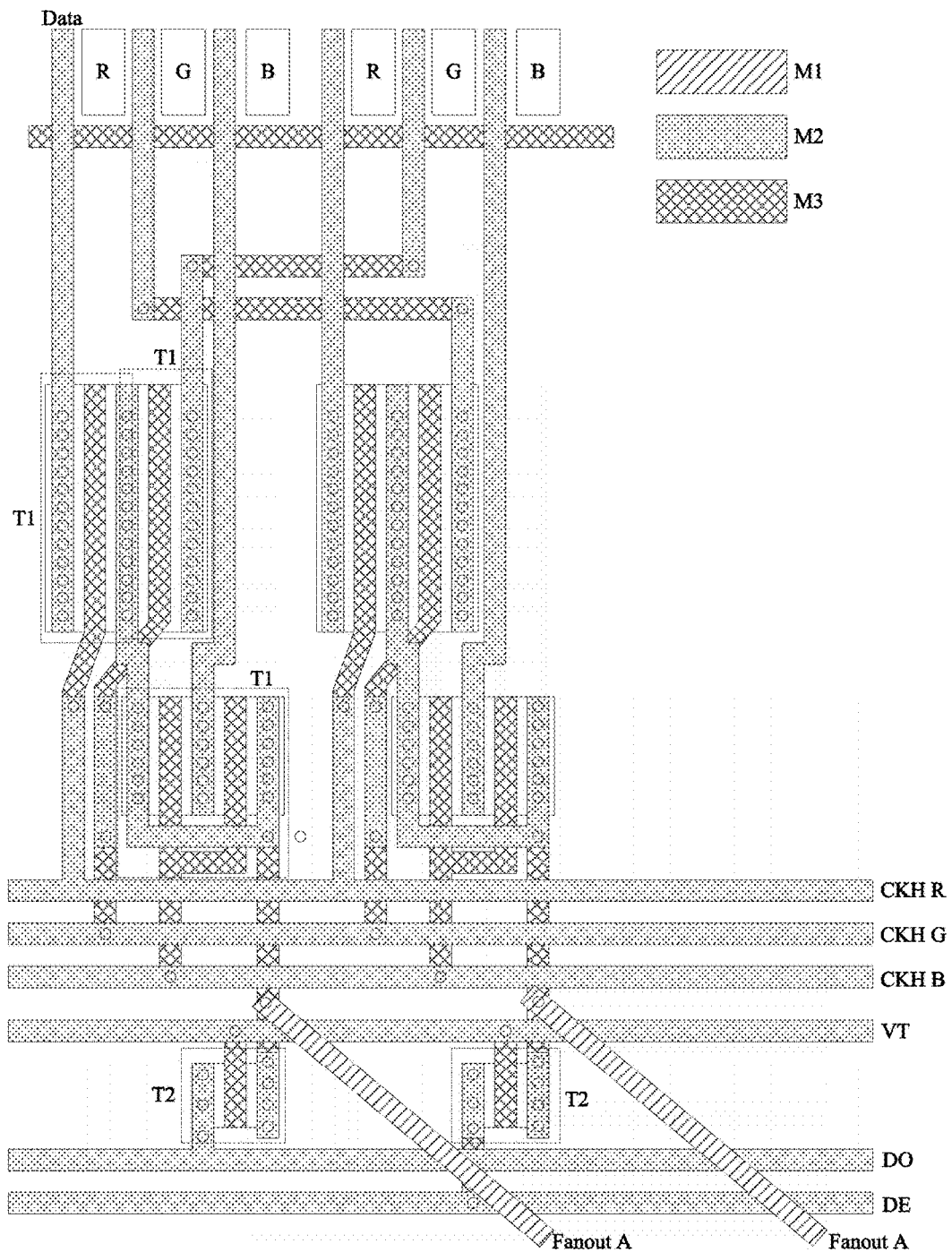
FIG. 4A to FIG. 4D are schematic structural diagrams respectively corresponding to FIG. 3A to FIG. 3D in top views.

In a specific implementation, in the array substrate above according to the embodiment of the disclosure, as can be apparent from the real sizes of the plurality of data signal fanout wires Fanout A and the test switch assembly VT SW, the width of the plurality of data signal fanout wires Fanout A is far larger than the width of the test switch assembly VT SW, so in order to reduce the width of the lower border as many as possible, as illustrated in FIG. 2A and FIG. 3A, the width of the plurality of data signal fanout wires Fanout A can be set to completely cover the width of the test switch assembly VT SW so that the width of the test switch assembly VT SW can be subtracted from the total width of the lower border to thereby reduce the width of the lower border as many as possible. Of course, in a real design, alternatively the plurality of data signal fanout wires Fanout A and the test switch assembly VT SW can be arranged to partially overlap in the width direction as needed, that is, there is such an area of the test switch assembly VT SW that is not covered by the plurality of data signal fanout wires Fanout A in the width direction, although the embodiment of the disclosure will not be limited thereto. Here FIG. 3A is a specific schematic structural circuit corresponding to FIG. 2A, and FIG. 4A is a schematic structural diagram corresponding to FIG. 3A in a specific top view.

Figure 3B:
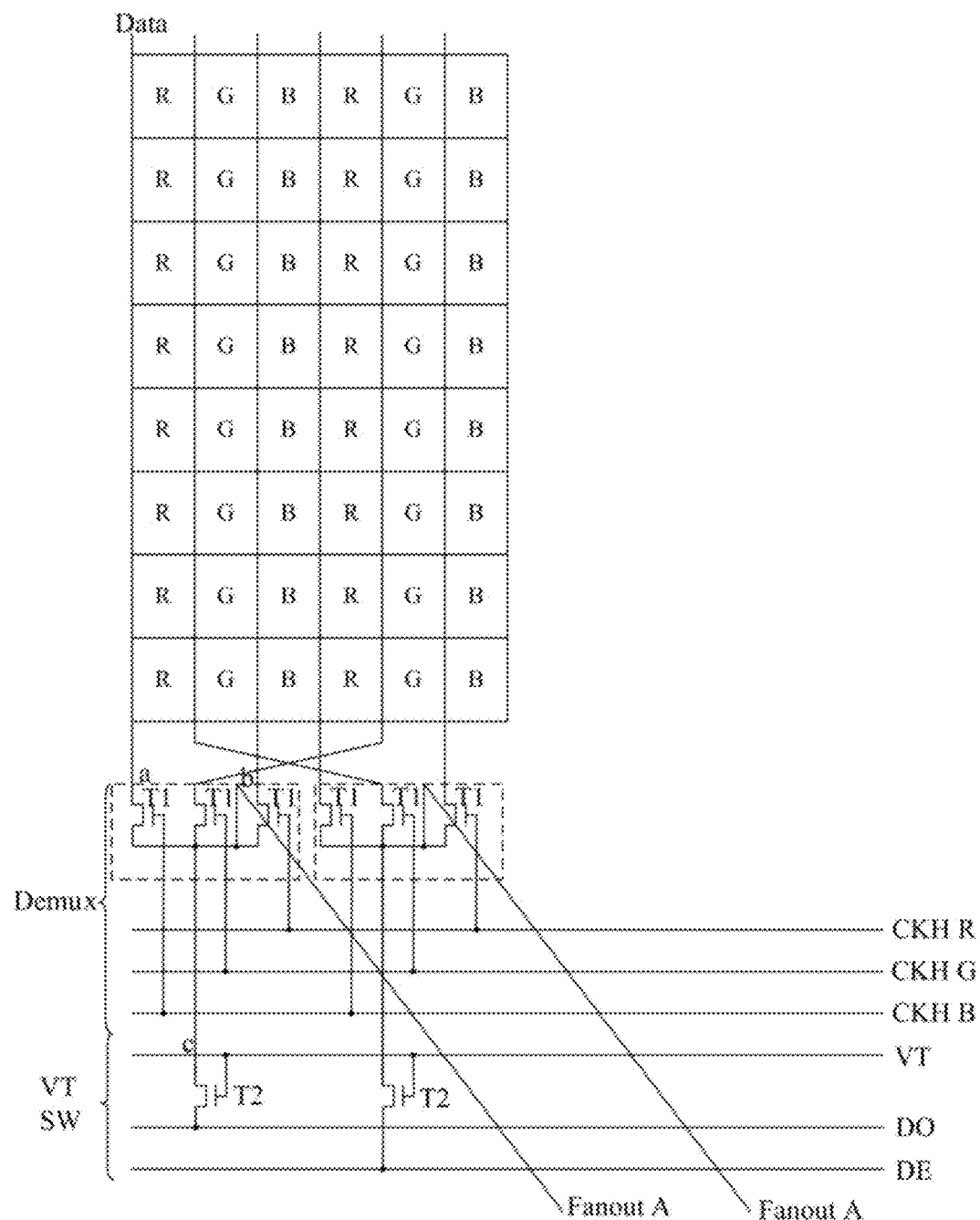
Figure 4B:
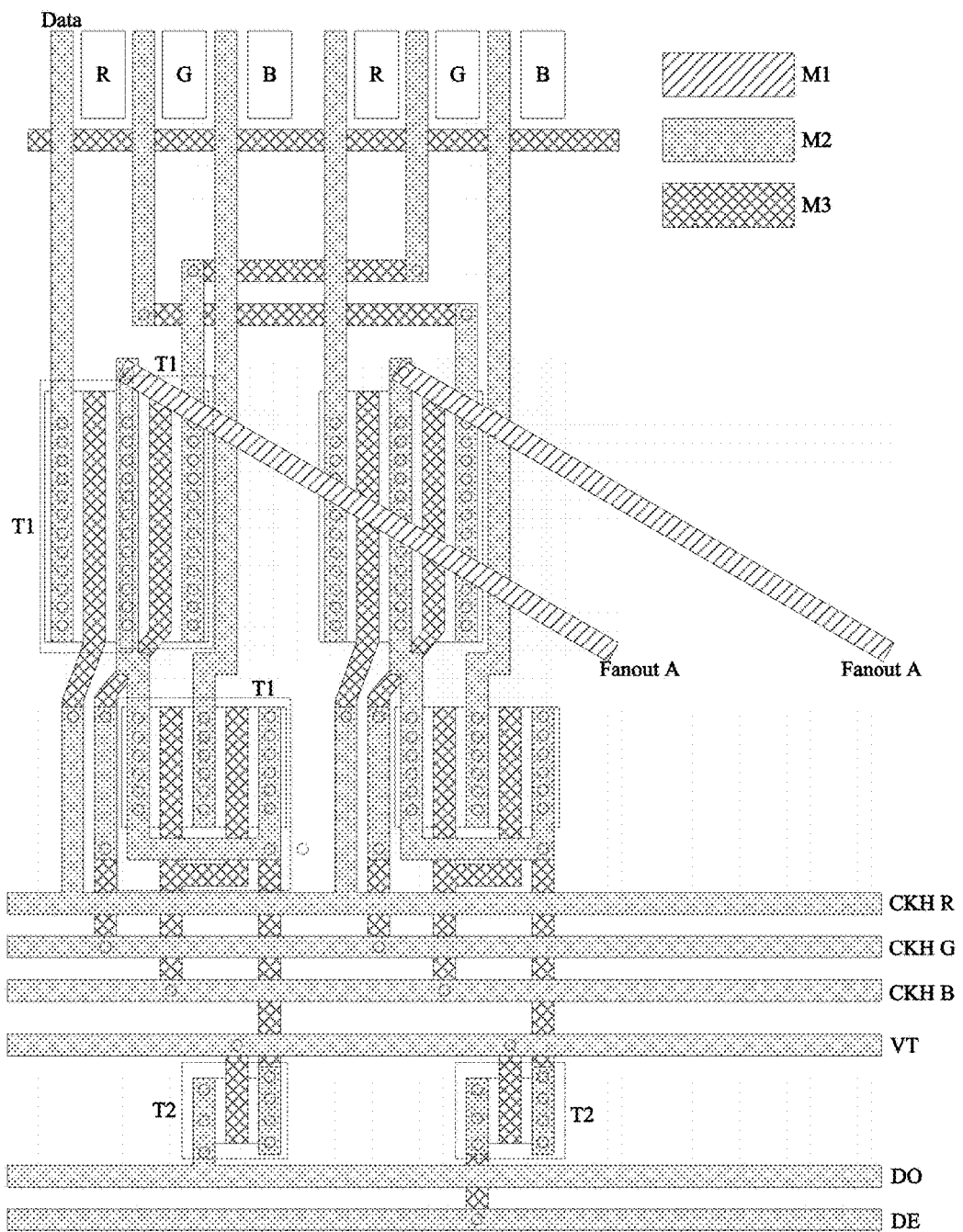

Furthermore in the array substrate above according to the embodiment of the disclosure, in order to further reduce the width of the lower border, as illustrated in FIG. 2B and FIG. 3b, the plurality of data signal fanout wires Fanout A can further overlap with, and be arranged at a different layer from, the demultiplexer assembly Demux so that the plurality of data signal fanout wires Fanout A and the demultiplexer assembly Demux arranged in the non-display area are changed to be arranged at different layers, for example, the plurality of data signal fanout wires Fanout A may be arranged above the film layer where the demultiplexer assembly Demux is located so that their positive projections onto the array substrate overlap, and furthermore their structures are adjusted so that they overlap, unlike the elements arranged in a sequential order in the non-display area of the existing array substrate, and in this way, the width of the non-display area can be further reduced without affecting the performance and the sizes of the respective elements at the lower border, for the further effect of a narrow border of the array substrate without being more demanding for the fabrication process, and without degrading the good yield ratio. Here FIG. 3B is a specific schematic structural circuit corresponding to FIG. 2B, and FIG. 4B is a schematic structural diagram corresponding to FIG. 3B in a specific top view.

Moreover in a specific implementation, in the array substrate above according to the embodiment of the disclosure, as can be apparent from the real sizes of the plurality of data signal fanout wires Fanout A and the demultiplexer assembly Demux, the width of the plurality of data signal fanout wires Fanout A is far larger than the sum of the widths of the demultiplexer assembly Demux and the test switch assembly VT SW, so in order to reduce the width of the lower border as many as possible, as illustrated in FIG. 2B and FIG. 3B, the width of the plurality of data signal fanout wires Fanout A can be set to completely cover the widths of the demultiplexer assembly Demux and the test switch assembly VT SW so that the widths of the demultiplexer assembly Demux and the test switch assembly VT SW can be subtracted from the total width of the lower border to thereby reduce the width of the lower border as many as possible. Of course, in a real design, alternatively the plurality of data signal fanout wires Fanout A and the demultiplexer assembly Demux can be arranged to partially overlap in the width direction as needed, that is, there is such an area of the demultiplexer assembly Demux that is not covered by the plurality of data signal fanout wires Fanout A in the width direction, although the embodiment of the disclosure will not be limited thereto.

Figure 1B:
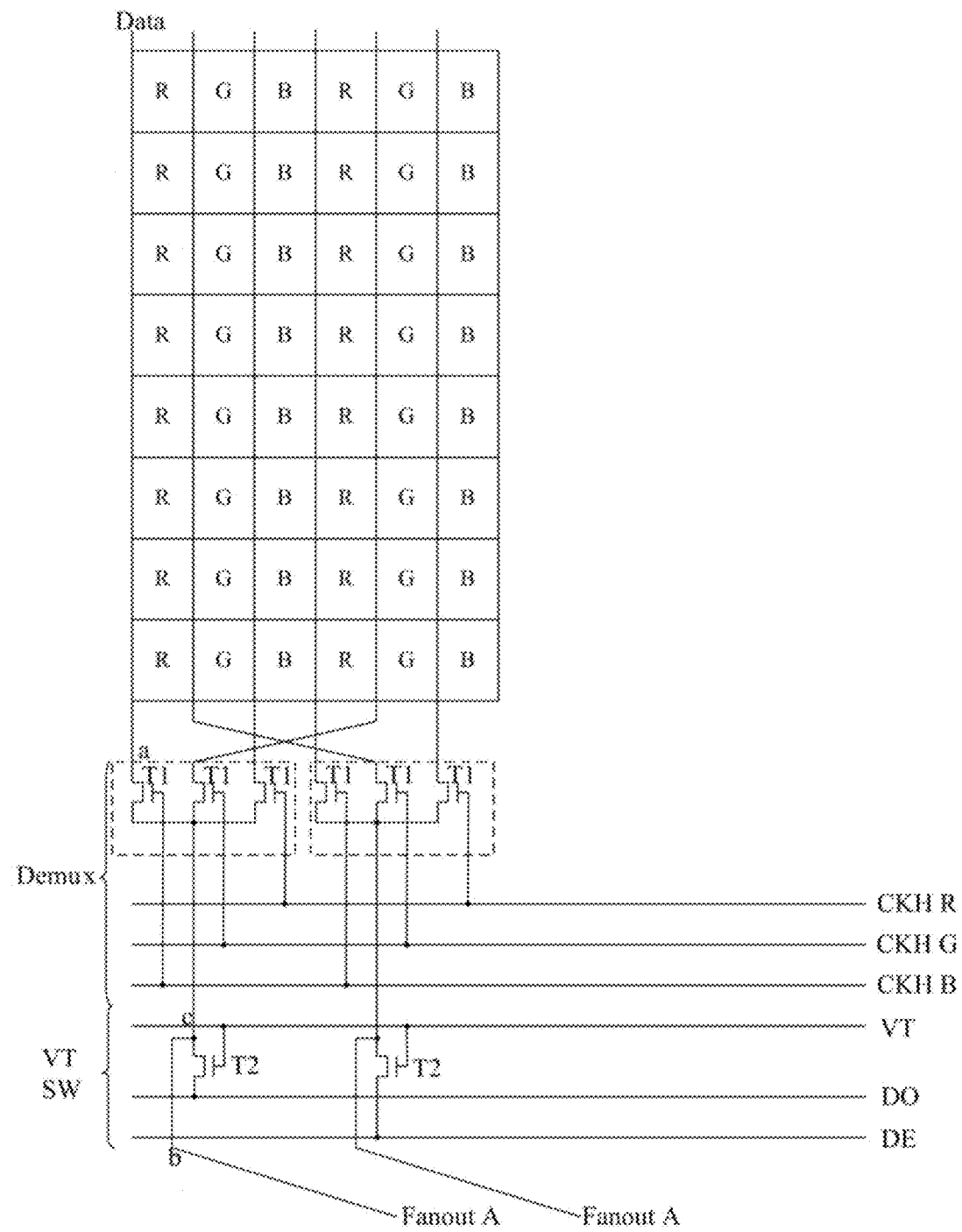
FIG. 1B and FIG. 1C are schematic structural circuit diagrams respectively of the array substrate in the prior art.

In a specific implementation, in order to enable the width of the plurality of data signal fanout wires Fanout A to completely cover the widths of the demultiplexer assembly Demux and the test switch assembly VT SW to thereby reduce the width of the lower border as many as possible, in the array substrate above according to the embodiment of the disclosure, as illustrated in FIG. 3B, the first signal input terminals b and the signal output terminals a of the demultiplexer assembly Demux can be arranged on the same side as the side of the demultiplexer assembly Demux proximate to the display area AA, that is, the positions of the first signal input terminals b of the demultiplexer assembly Demux, electrically connected with the plurality of data signal fanout wires Fanout A are changed from the side of the test switch assembly VT SW away from the demultiplexer assembly Demux in the prior art as illustrated in FIG. 1B to the side of the demultiplexer assembly Demux proximate to the display area AA as illustrated in FIG. 3B so that the start terminal of the plurality of data signal fanout wires Fanout A is located on the side of the demultiplexer assembly Demux proximate to the display area, and after the plurality of data signal fanout wires Fanout A cover the demultiplexer assembly Demux and the test switch assembly VT SW, the end terminal of the plurality of data signal fanout wires Fanout A appears on the side of the test switch assembly VT SW away from the demultiplexer assembly Demux. Since the demultiplexer assembly Demux and the test switch assembly VT SW are arranged at different film layers from the plurality of data signal fanout wires Fanout A, the demultiplexer assembly Demux and the test switch assembly VT SW can be covered by the plurality of data signal fanout wires Fanout A in the width direction without any disorder of wiring and any signal interference.

In a specific implementation, in the array substrate above according to the embodiment of the disclosure, in order to enable the plurality of data signal fanout wires Fanout A to be arranged respectively at a different film layer from the demultiplexer assembly Demux and the test switch assembly VT SW, specifically as illustrated in FIG. 4A to FIG. 4D, the plurality of data signal fanout wires Fanout A can be arranged at a first electrically-conductive layer M1, and in order to facilitate subsequent wiring, the first electrically-conductive layer M1 can be located above the demultiplexer assembly Demux and the test switch assembly VT SW, that is, the first electrically-conductive layer M1 is the topmost electrically-conductive film layer. Of course, in a specific implementation, a first electrically-conductive layer M1 can alternatively be added between any two existing electrically-conductive layers in the existing array substrate although the embodiment of the disclosure will not be limited thereto.

Furthermore in the array substrate above according to the embodiment of the disclosure, as illustrated in FIG. 4A to FIG. 4D, electrically-conductive patterns in the demultiplexer assembly Demux can be arranged respectively at a second electrically-conductive M2 and a third electrically-conductive M3, where the first electrically-conductive layer M1 is located above the second electrically-conductive layer M2 located above the third electrically-conductive layer M3, that is, the demultiplexer assembly Demux can be arranged at the two existing electrically-conductive layers M2 and M3 in the existing array substrate, both of the electrically-conductive layers M2 and M3 are located below the first electrically-conductive layer M1.

In a specific implementation, in the array substrate above according to the embodiment of the disclosure, the demultiplexer assembly Demux is generally configured to connect the plurality of data lines Data with one data signal fanout wire Fanout A so that the plurality of data lines Data are provided with data signals over the data signal fanout wire Fanout A by turning on a plurality of switch elements in a time division mode, and in this way, the number of data signal fanout wires Fanout A can be reduced as compared with the number of data lines Data to thereby make it convenient to subsequently electrically connect the driver chip IC with the data signal fanout wires Fanout A. Hereupon the demultiplexer assembly Demux as illustrated in FIG. 3A to FIG. 3D generally includes: a plurality of first thin film transistors T1, and a plurality of clock control signal lines CKH R, CKH G, and CKH B, where:

The respective first thin film transistors T1 correspond respectively to the respective data lines Data; the first thin film transistors T1 are grouped into a plurality of groups (as denoted by the dotted box), each of the groups corresponds to one data signal fanout wire Fanout A; and FIG. 3A to FIG. 3D illustrate two groups of first thin film transistors T1 corresponding respectively to two data signal fanout wires Fanout A.

The respective first thin film transistors T1 in each group of first thin film transistors T1 include sources electrically connected with the corresponding data signal fanout wire Fanout A, gates electrically connected with the different clock control signal lines CKH R, CKH G, and CKH B, and drains electrically connected with the different data lines Data.

In a specific application, threshold voltage is applied to the clock control signal lines CKH R, CKH G, and CKH B in that order periodically so that the respective first thin film transistors T1 in each group of first thin film transistors T1 connected correspondingly with the clock control signal lines CKH R, CKH G, and CKH B are turned on in order periodically, where if a first thin film transistor T1 is turned on, then the data signal fanout wire Fanout A and the corresponding data line Data will be onstate to apply a data signal required for the corresponding data line Data.

In a specific implementation, in the array substrate above according to the embodiment of the disclosure, in order to create the patterns of the first thin film transistors T1, and the clock control signal lines CKH R, CKH G, and CKH B in the demultiplexer assembly Demux, as illustrated in FIG. 4A to FIG. 4D, the sources and the drains of the first thin film transistors T1, and the clock control signal lines CKH R, CKH G, and CKH B can be arranged at the second electrically-conductive layer M2; and as illustrated in FIG. 4A to FIG. 4D, jumpers in the demultiplexer assembly Demux, and the gates of the first thin film transistors T1 can be arranged at the third electrically-conductive layer M3, where a jumper in the demultiplexer assembly Demux refers to a wire across an overlapping section between two elements, for example, the source of the first thin film transistor T1 needs to be electrically connected with the data signal fanout wire Fanout A through a jumper intersecting with the clock control signal lines CKH R, CKH G, and CKH B in FIG. 4A.

Alike in a specific implementation, in the array substrate above according to the embodiment of the disclosure, as illustrated in FIG. 4A to FIG. 4D, electrically-conductive patterns in the test switch assembly VT SW can also be arranged respectively at the second electrically-conductive layer M2 and the third electrically-conductive layer M3, that is, the test switch assembly VT SW can be arranged at the two existing electrically-conductive layers M2 and M3 in the existing array substrate, both of the electrically-conductive layers M2 and M3 are arranged below the first electrically-conductive layer M1.

In a specific implementation, in the array substrate above according to the embodiment of the disclosure, the test switch assembly VT SW is generally configured to test the array substrate before the driver chip IC is installed, by loading a data signal on the data lines Data in the display area, to thereby test the display area for its quality eligibility against a quality check criterion. Hereupon the test switch assembly VT SW as illustrated in FIG. 3A to FIG. 3D generally includes: at least two test signal lines DO and DE, a plurality of second thin film transistors T2, and a switch signal line VT, where the respective second thin film transistors T2 correspond respectively to the respective data signal fanout wires Fanout A; and drains of the second thin film transistors T2 are electrically connected with their corresponding data signal fanout wires Fanout A, and gates of the second thin film transistors T2 are electrically connected with the switch signal line V; and sources of every two adjacent second thin film transistors T2 are electrically connected respectively with the different test signal lines DO and DE.

Specifically FIG. 3A to FIG. 3D illustrate two test signal lines DO and DE by way of an example, where the sources of the odd second thin film transistors T2 are electrically connected with the test signal line DO, and the gates of the even second thin film transistors T2 are electrically connected with the test signal line DE. If a start signal is applied on the switch signal line VT, then all the second thin film transistors T2 will be turned on, and short-circuit and broken-circuit conditions of the data lines may be measured by loading a test signal on the test signal lines DO and DE in a time division mode, or loading a test signal on all of them.

In a specific implementation, in the array substrate above according to the embodiment of the disclosure, in order to create the patterns of the second thin film transistors T2, the test signal lines DO and DE, and the switch signal line VT in the test switch assembly VT SW, as illustrated in FIG. 4A to FIG. 4D, the sources and the drains of the second thin film transistors T2, the test signal lines DO and DE, and the switch signal line VT can be arranged at the second electrically-conductive layer M2; and jumpers in the test switch assembly VT SW, and the gates of the second thin film transistors T2, can be arranged at the third electrically-conductive layer M3, where a jumper in the test switch assembly VT SW refers to a wire across an overlapping section between two elements, for example, the drain of the second thin film transistor T2 needs to be electrically connected with the data signal fanout wire Fanout A through a jumper intersecting with the switch signal line VT in FIG. 4A.

Figure 3C:
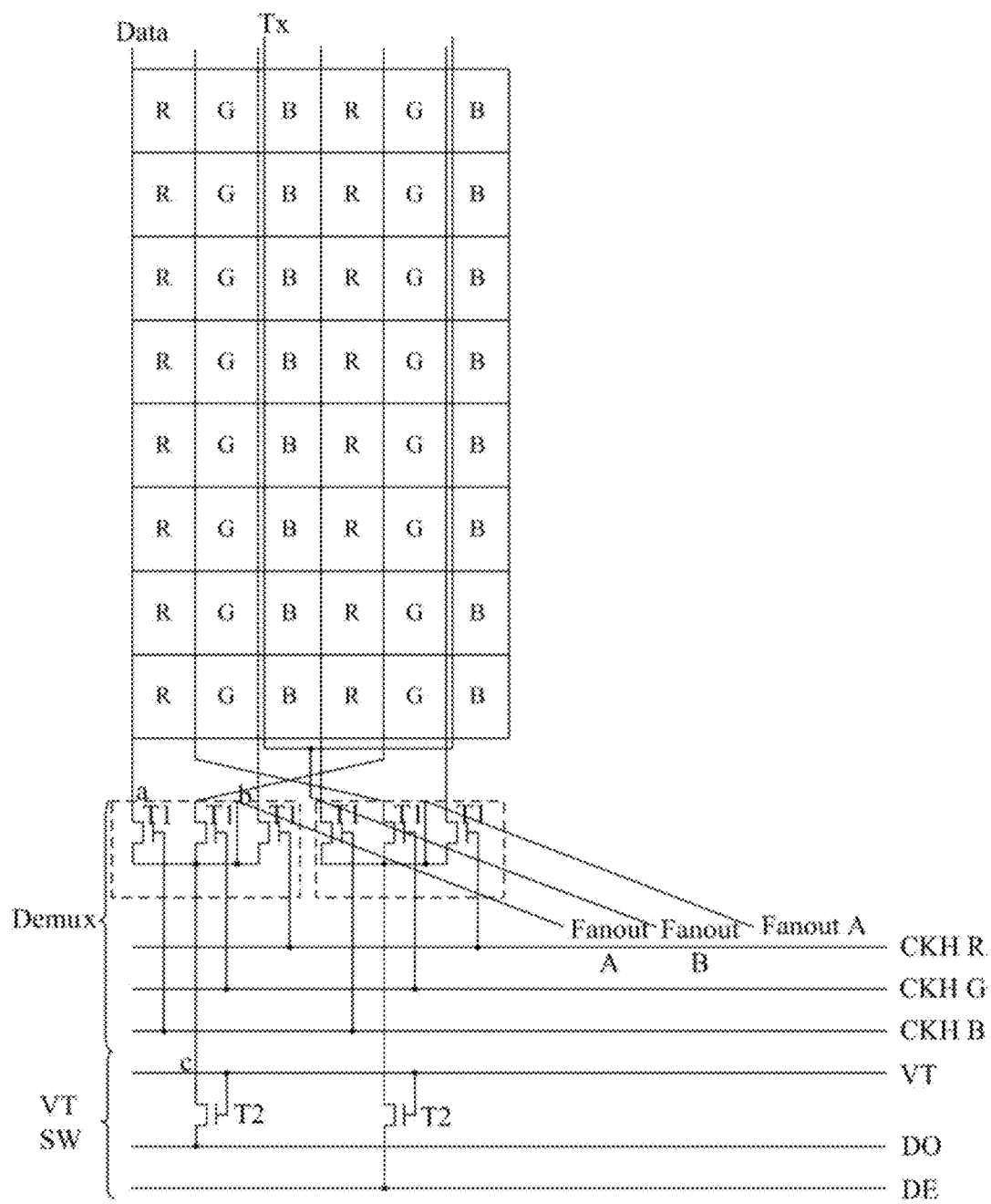
Figure 3D:
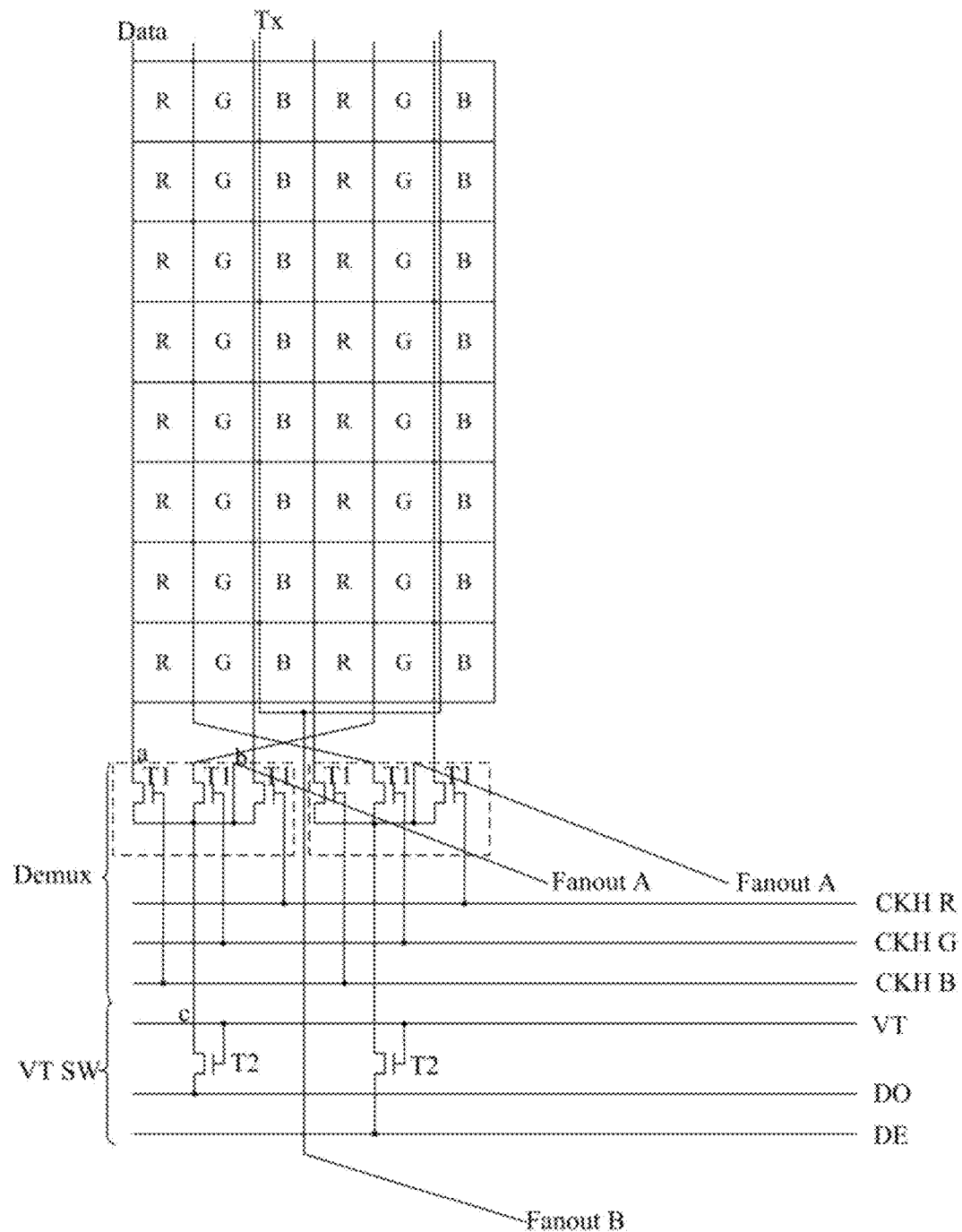

Furthermore in order to perform a touch function, the array substrate above according to the embodiment of the disclosure can further include touch electrodes, for example, the common electrode can be segmented, and a part thereof can be reused as a touch electrode, or the pattern of a touch electrode can be arranged separately, although the embodiment of the disclosure will not be limited thereto. If the array substrate includes the touch function, then in order to pass a touch signal, as illustrated in FIG. 3C and FIG. 3D, the array substrate may further include: a plurality of touch signal lines Tx arranged in the display area AA, and a plurality of touch signal fanout wires Fanout B arranged in the non-display area, where the touch signal lines Tx generally are electrically connected respectively with the touch signal fanout wires Fanout B, and specifically they can correspond to each other in a one-to-one manner; or as illustrated in FIG. 3C and FIG. 3D, two touch signal lines Tx can be electrically connected respectively with one data signal fanout wire Fanout B. Each of the touch signal fanout wires Fanout B includes one terminal connected with the touch signal line Tx, and the other terminal generally connected with the driver chip IC to transmit a touch signal applied between the driver chip IC and the touch signal line Tx.

Figure 1C:
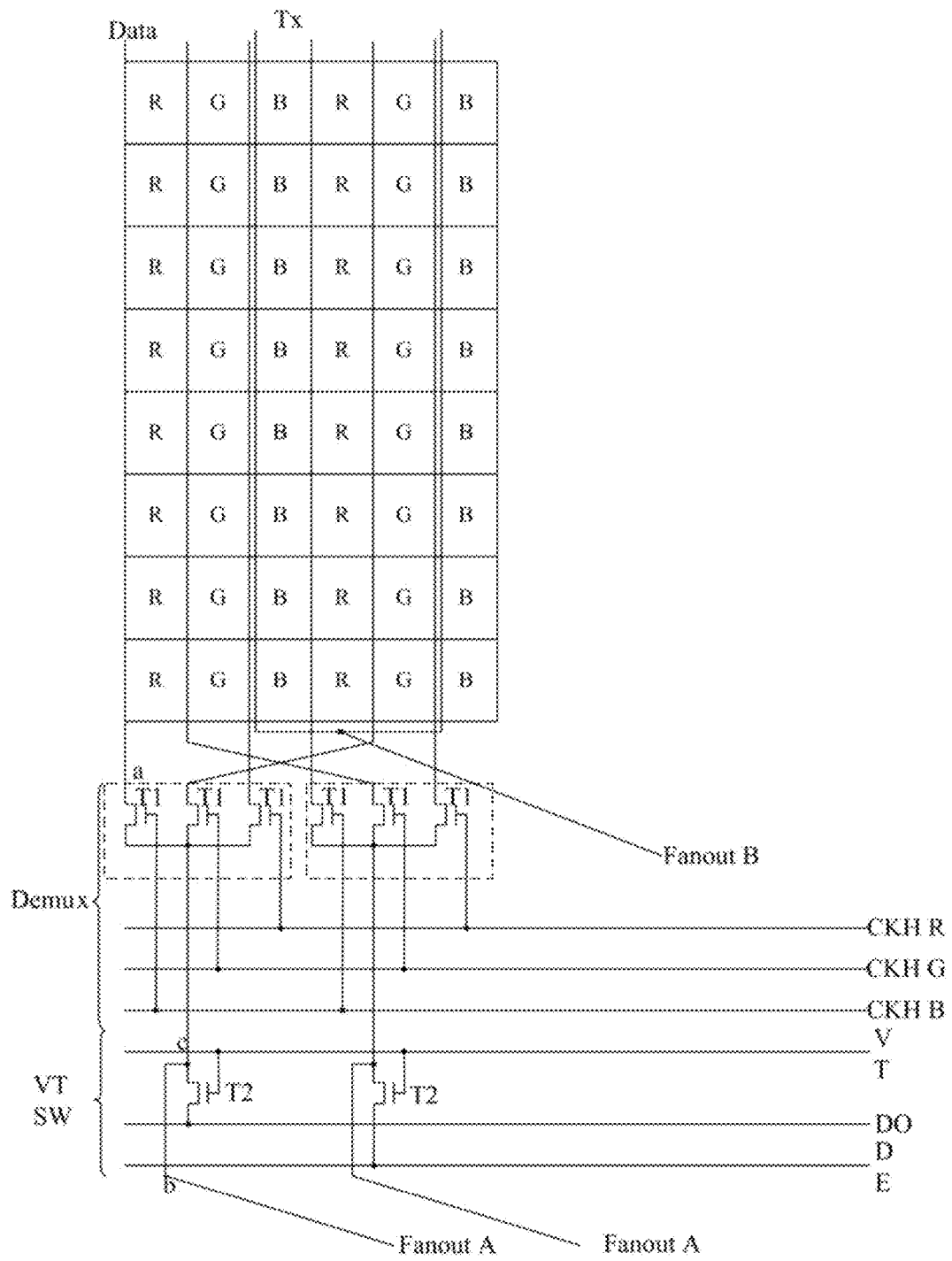
Figure 1D:
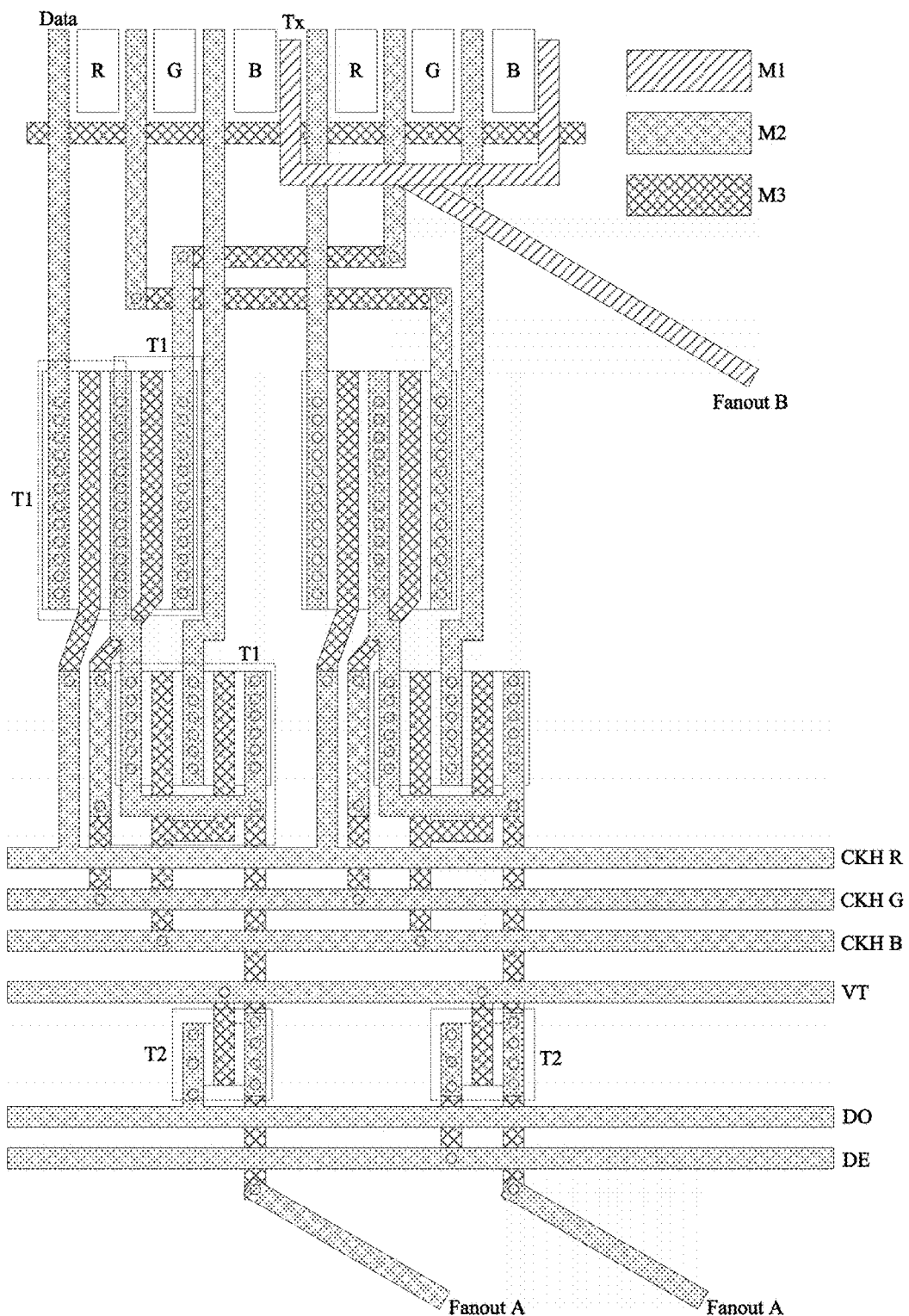
FIG. 1D is a schematic structural diagram corresponding to FIG. 1C in a top view.
Figure 4C:
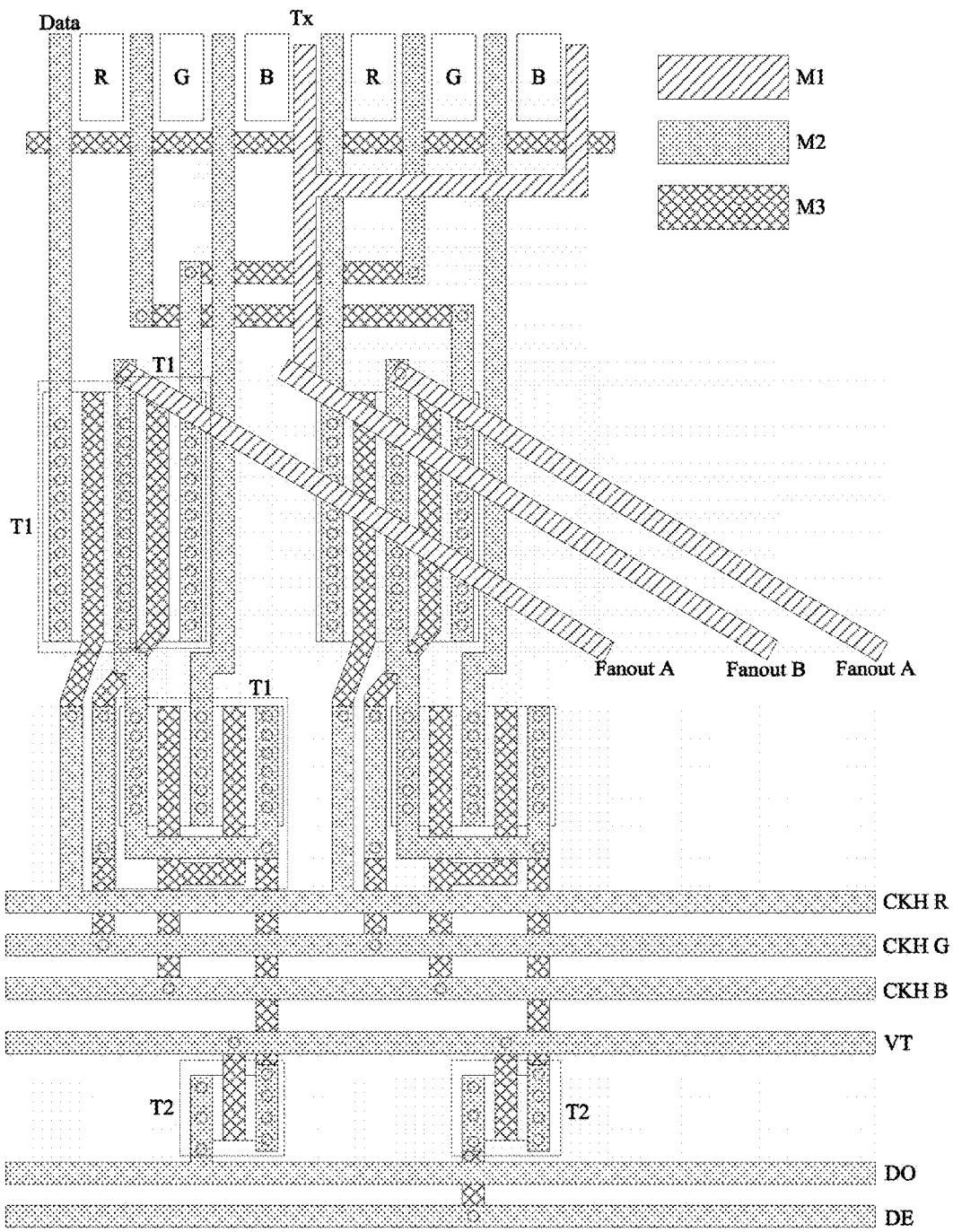
Figure 4D:
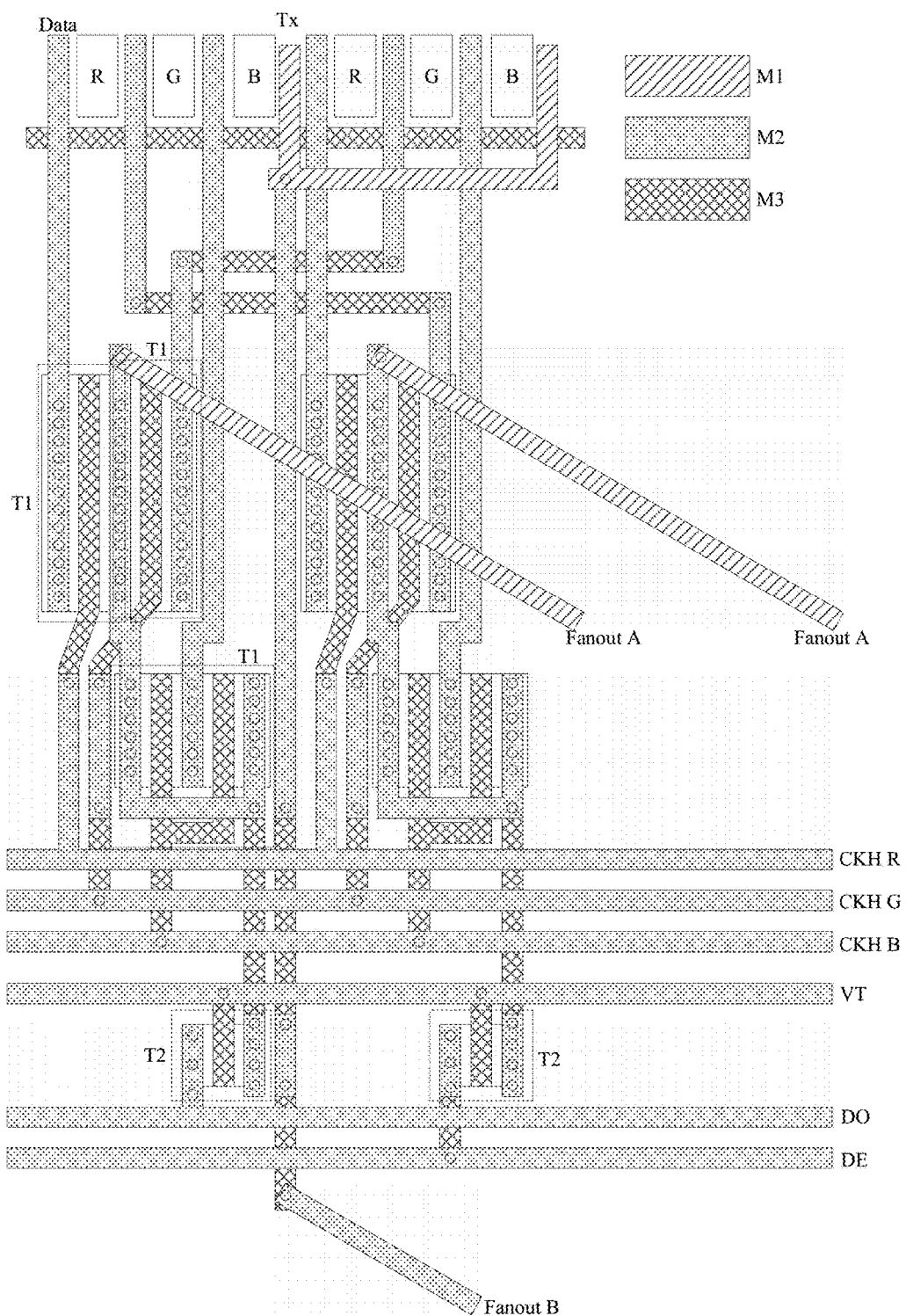

In a specific implementation, in the array substrate above according to the embodiment of the disclosure, the data lines Data and the touch signal wires Tx generally are arranged at different layers in the display area AA to thereby avoid the wiring from affecting an aperture ratio. As illustrated in FIG. 4C to FIG. 4D, for example, typically the data lines Data are arranged at the second electrically-conductive layer M2, and the touch signal lines Tx are arranged at the first electrically-conductive layer M1, that is, the touch signal lines Tx is located at a film layer above the film layer where the data lines Data are located. Furthermore as illustrated in FIG. 1D, the existing touch signal fanout wires Fanout B generally are arranged at the same layer as the touch signal lines Tx, that is, both of them are arranged at the first electrically-conductive layer M1.

Hereupon in a specific implementation, in the array substrate above according to the embodiment of the disclosure, if there are a small number of data signal fanout wires Fanout A at the first electrically-conductive layer M1, then the plurality of touch signal fanout wires Fanout B may remain arranged at the first electrically-conductive layer M1 as illustrated in FIG. 3C and FIG. 4C. Stated otherwise, both the data signal fanout wires Fanout A and the touch signal fanout wires Fanout B may be arranged at the first electrically-conductive layer M1 while maintaining the position of the film layer where the plurality of touch signal fanout wires Fanout B are located in the existing array substrate as illustrated in FIG. 1C. Here FIG. 4C is a schematic structural diagram corresponding to FIG. 3C in a specific top view.

Alternatively in a specific implementation, in the array substrate above according to the embodiment of the disclosure, if there are a large number of data signal fanout wires Fanout A at the first electrically-conductive layer M1, then as illustrated in FIG. 3D and FIG. 4D, the plurality of touch signal fanout wires Fanout B may be changed from the first electrically-conductive layer M1 as illustrated in FIG. 1C in the prior art to the second electrically-conductive layer M2 to thereby accommodate a wiring space required for the data signal fanout wires Fanout A so that the data signal fanout wires Fanout A are arranged at only the first electrically-conductive layer M1. Here FIG. 4D is a schematic structural diagram corresponding to FIG. 3D in a specific top view, and FIG. 1D is a schematic structural diagram corresponding to FIG. 1C in a specific top view.

In a specific implementation, as illustrated in FIG. 2C, the array substrate above according to the embodiment of the disclosure generally further includes: a driver chip IC and a Flexible Printed Circuit (FPC) Pad arranged in the non-display area, where the driver chip IC includes one terminal electrically connected respectively with the data signal fanout wires Fanout A and the touch signal fanout wires Fanout B, and the other terminal electrically connected with the Flexible Printed Circuit (FPC) Pad through connection wires. The driver chip IC is generally configured to provide signals on the data lines and the touch signal lines, and the Flexible Printed Circuit (FPC) Pad is generally configured to be jointed with an external Flexible Printed Circuit (FPC) pad.

In a specific implementation, in the array substrate above according to the embodiment of the disclosure, as illustrated in FIG. 2C, the driver chip IC is generally arranged on the sides of the data signal fanout wires Fanout A and the touch signal fanout wires Fanout B away from the display area AA; and the Flexible Printed Circuit (FPC) Pad is generally arranged on the side of the driver chip IC away from the display area AA.

Preferably as illustrated in FIG. 2C, in the array substrate above according to the embodiment of the disclosure, in order to reduce the width of the lower border as many as possible, the data signal fanout wires Fanout A and the touch signal fanout wires Fanout B, the driver chip IC, and the Flexible Printed Circuit (FPC) Pads are arranged in that order from the display area AA to the outer edge. Furthermore the demultiplexer assembly Demux and the test switch assembly VT SW are arranged below the data signal fanout wires Fanout A and the touch signal fanout wires Fanout B, and overlap with them in the width direction. If the width of the data signal fanout wires Fanout A is typically approximately 2080 μm, and the widths of the driver chip IC and the Flexible Printed Circuit (FPC) Pad are typically approximately 2300 μm, then the width of the lower border may be only 4380 μm sufficient to be satisfactory, thus dispensing with the sum of the widths of the demultiplexer assembly Demux and the test switch assembly VT SW, which is approximately 700 μm, to thereby facilitate a design of a narrow border.

Figure 5:
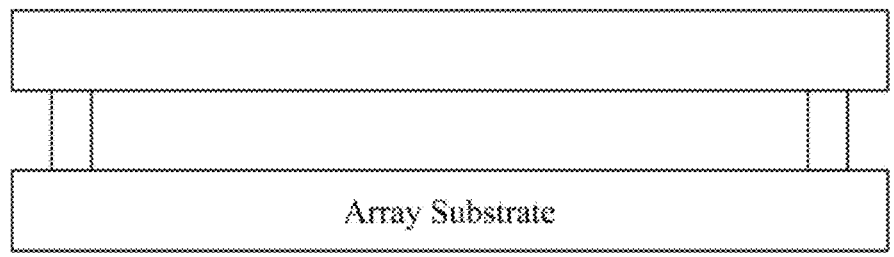
FIG. 5 is a schematic structural diagram of a display panel according to an embodiment of the disclosure.

Based upon the same inventive idea, an embodiment of the disclosure further provides a display panel as illustrated in FIG. 5 including the array substrate according to any one of the embodiments above of the disclosure, and the display panel can be a liquid crystal display panel, an organic light-emitting display panel, a plasma display panel, or any other display panel including an array substrate. The display panel may be a rigid display panel or may be a flexible display panel, and FIG. 5 simply illustrates a rigid display panel, but the embodiment of the disclosure will not be limited thereto. Reference can be made to the embodiments of the display substrate above for an implementation of the display panel, so a repeated description thereof will be omitted here.

Figure 6:
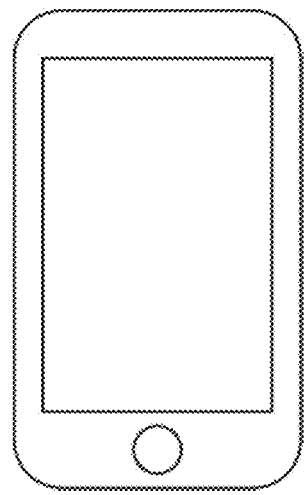
FIG. 6 is a schematic structural diagram of a display device according to an embodiment of the disclosure.

Based upon the same inventive idea, an embodiment of the disclosure further provides a display device as illustrated in FIG. 6 including the display panel according to the embodiment above of the disclosure, where the display device can be a mobile phone, a tablet computer, a TV set, a display, a notebook computer, a digital photo frame, a navigator, or any other product or component capable of displaying. Reference can be made to the embodiment of the display panel above for an implementation of the display device, so a repeated description thereof will be omitted here.

In the array substrate, the display panel, and the display device above according to the embodiments of the disclosure, the array substrate includes: a plurality of data lines arranged in a display area, and a demultiplexer assembly, a test switch assembly, and a plurality of data signal fanout wires, arranged respectively in a non-display area, where the demultiplexer assembly includes signal output terminals electrically connected with the plurality of data lines, first signal input terminals electrically connected with the plurality of data signal fanout wires, and second signal input terminals electrically connected with output terminals of the test switch assembly; and the test switch assembly is arranged on the side of the demultiplexer assembly away from the display area. The plurality of data signal fanout wires and the test switch assembly, arranged in the non-display area are changed to be arranged at different layers so that they overlap, unlike the elements arranged in a sequential order in the non-display area of the existing array substrate, and in this way, the width of the non-display area can be reduced without affecting the performance and the sizes of the respective elements at the lower border, for the effect of a narrow border of the array substrate without being more demanding for the fabrication process, and without degrading the good yield ratio.

Evidently those skilled in the art can make various modifications and variations to the disclosure without departing from the spirit and scope of the disclosure. Accordingly the disclosure is also intended to encompass these modifications and variations thereto so long as the modifications and variations come into the scope of the claims appended to the disclosure and their equivalents.

What is claimed is:

1. An array substrate, comprising a display area, and a non-display area surrounding the display area,
wherein the display area comprises a plurality of data lines;
wherein the non-display area comprises a demultiplexer assembly, a test switch assembly, a plurality of data signal fanout wires, and a driver chip IC;
wherein the demultiplexer assembly has a side proximate to the display area and another side away from the display area, and wherein the demultiplexer assembly includes:
a plurality of signal output terminals electrically connected with the plurality of data lines in the display area;
a plurality of first signal input terminals electrically connected with the plurality of data signal fanout wires; and
a plurality of second signal input terminals electrically connected with the plurality of signal output terminals of the test switch assembly;
wherein the test switch assembly is arranged on the side of the demultiplexer assembly away from the display area;
wherein the plurality of data signal fanout wires are arranged at a different layer than the test switch assembly, and wherein an orthographic projection of the plurality of data signal fanout wires on the array substrate overlaps with an orthographic projection of the test switch assembly on the array substrate;
wherein the driver chip IC includes one terminal electrically connected with the plurality of data signal fanout wires; and wherein the driver chip IC is arranged on a side of test switch assembly away from the display area.

2. The array substrate according to claim 1, wherein the plurality of data signal fanout wires is arranged at a different layer than the demultiplexer assembly, and wherein the orthographic projection of the plurality of data signal fanout wires on the array substrate overlaps with an orthographic projection of the demultiplexer assembly on the array substrate.

3. The array substrate according to claim 2, wherein the plurality of first signal input terminals and signal output terminals of the demultiplexer assembly are arranged on a same side as the side of the demultiplexer assembly proximate to the display area.

4. The array substrate according to claim 1, wherein the plurality of data signal fanout wires is arranged at a first electrically-conductive layer located above the demultiplexer assembly and the test switch assembly.

5. The array substrate according to claim 4, wherein electrically-conductive patterns in the demultiplexer assembly are arranged respectively at a second electrically-conductive layer and a third electrically-conductive layer; and wherein the first electrically-conductive layer is located above the second electrically-conductive layer, wherein the second electrically-conductive layer is located above the third electrically-conductive layer.

6. The array substrate according to claim 5, wherein the demultiplexer assembly further comprises: a plurality of first thin film transistors, and a plurality of clock control signal lines;
   wherein the plurality of first thin film transistors each is associated with one of the plurality of data lines; and
   wherein the plurality of first thin film transistors is divided into groups and each of the groups is associated with one of the plurality of data signal fanout wires; and
   wherein the plurality of first thin film transistors each comprises a source electrically connected with said data signal fanout wire, a gate electrically connected with one of the plurality of clock control signal lines, and a drain electrically connected with one of the plurality of data lines.

7. The array substrate according to claim 6, wherein the source and the drain of said first thin film transistor, and the plurality of clock control signal lines are arranged at the second electrically-conductive layer; and
   wherein jumpers in the demultiplexer assembly, and the gates of the plurality of the first thin film transistors are arranged at the third electrically-conductive layer.

8. The array substrate according to claim 5, wherein electrically-conductive patterns in the test switch assembly are arranged respectively at the second electrically-conductive layer and the third electrically-conductive layer.

9. The array substrate according to claim 8, wherein the test switch assembly comprises: at least two test signal lines, a plurality of second thin film transistors, and a switch signal line:
   wherein the plurality of second thin film transistors each is associated with one of the plurality of data signal fanout wires;
   wherein the plurality of second thin film transistors each comprises: a drain electrically connected with the associated said data signal fanout wires, a gate electrically connected with the switch signal line; and a source, wherein the sources of every two adjacent said second thin film transistors are electrically connected with different test signal lines, respectively.

10. The array substrate according to claim 9, wherein the sources and the drains of the plurality of second thin film transistors, the test signal lines, and the switch signal line are arranged at the second electrically-conductive layer; and
    wherein jumpers in the test switch assembly, and the gates of the plurality of second thin film transistors are arranged at the third electrically-conductive layer.

11. The array substrate according to claim 5, further comprising: a plurality of touch signal lines arranged in the display area, and a plurality of touch signal fanout wires arranged in the non-display area, wherein:
    the plurality of touch signal lines each is electrically connected with an associated one of the plurality of touch signal fanout wires.

12. The array substrate according to claim 11, wherein the plurality of touch signal fanout wires and the plurality of touch signal lines are arranged on the first electrically-conductive layer.

13. The array substrate according to claim 11, wherein the plurality of touch signal lines is arranged on the first electrically-conductive layer; and wherein the plurality of touch signal fanout wires is arranged at the second electrically-conductive layer.

14. The array substrate according to claim 11, further comprising: a flexible printed circuit pad arranged in the non-display area, wherein:
    the one terminal of the driver chip IC is connected with the plurality of touch signal fanout wires, and wherein the driver chip IC further comprises another terminal electrically connected with the flexible printed circuit pad through connection wires.

15. The array substrate according to claim 14, wherein the driver chip IC is arranged on a side of an area where the data signal fanout wires and the touch signal fanout wires are located away from the display area; and
    wherein the flexible printed circuit pad is arranged on a side of the driver chip IC away from the display area.

16. A display panel, comprising the array substrate according to claim 1.

17. A display device, comprising the display panel according to claim 16.

* * * * *